US006825475B2

(12) United States Patent
Petrov et al.

(10) Patent No.: US 6,825,475 B2
(45) Date of Patent: Nov. 30, 2004

(54) DEFLECTION METHOD AND SYSTEM FOR USE IN A CHARGED PARTICLE BEAM COLUMN

(75) Inventors: Igor Petrov, Holon (IL); Igor Krivts, Rehovot (IL); Zvika Rosenberg, Jerusalem (IL); Pavel Adamec, Haar (DE)

(73) Assignee: Applied Materials Israel, Ltd., Santa Clara, CA (US)

( * ) Notice: Subject to any disclaimer, the term of this patent is extended or adjusted under 35 U.S.C. 154(b) by 0 days.

(21) Appl. No.: 10/247,104

(22) Filed: Sep. 19, 2002

(65) Prior Publication Data

US 2004/0056207 A1 Mar. 25, 2004

(51) Int. Cl.[7] .......................... H01J 37/10; H01J 37/147
(52) U.S. Cl. ............................. 250/396 ML; 250/310; 250/396 R
(58) Field of Search ........................ 250/310, 396 ML, 250/396 R

(56) References Cited

U.S. PATENT DOCUMENTS

| | | | |
|---|---|---|---|
| 5,729,022 A | * | 3/1998 | Veneklasen et al. . 250/396 ML |
| 5,780,859 A | * | 7/1998 | Feuerbaum et al. .... 250/396 R |
| 6,084,238 A | * | 7/2000 | Todokoro et al. ........... 250/310 |
| 6,425,175 B1 | * | 7/2002 | Sawada et al. ................ 29/596 |
| 6,590,210 B1 | * | 7/2003 | Essers .......................... 250/310 |
| 6,674,075 B2 | * | 1/2004 | Petrov et al. ................ 250/310 |

FOREIGN PATENT DOCUMENTS

| | | |
|---|---|---|
| EP | 1045425 A2 | 10/2000 |
| WO | WO 01/45136 A1 | 6/2001 |
| WO | WO 01/56056 A3 | 8/2001 |
| WO | WO 01/56056 A2 | 8/2001 |

* cited by examiner

Primary Examiner—Nikita Wells
Assistant Examiner—Christopher M. Kalivoda
(74) Attorney, Agent, or Firm—Blakely, Sokoloff, Taylor & Zafman

(57) ABSTRACT

A deflection system is presented for use in a lens arrangement of a charged particle beam column for inspecting a sample. The system comprises a magnetic deflector operable to create a magnetic field, and a pole piece assembly at least partly accommodated within the magnetic field. The pole piece assembly has a portion made of a soft magnetic material and is formed with an opening for a charged particle beam propagation therethrough. The deflection system allows for conducting the magnetic field created by the magnetic deflector through the pole piece assembly towards the opening in the pole piece assembly. This enables to increase the magnetic field value in the vicinity of the sample at the optical axis of the lens arrangement at a given electric current through the excitation coils of the magnetic deflector, without a need to increase a working distance.

31 Claims, 4 Drawing Sheets

DEFLECTION METHOD AND SYSTEM FOR USE IN A CHARGED PARTICLE BEAM COLUMN

FIELD OF THE INVENTION

The present invention is in the field of inspection techniques of the kind utilizing irradiation of a sample by a focused beam of electrically charged particles, such as electrons, positrons, or ions, and relates to a deflection method and system, and a focusing/deflecting assembly utilizing the same, for use in a charged particle beam column.

BACKGROUND OF THE INVENTION

Charged particle beam columns are typically employed in scanning electron microscopy (SEM), which is a known technique widely used in the manufacture of semiconductor devices, being utilized in CD metrology tools, the so-called CD-SEM (critical dimension scanning electron microscope) and defect review SEM. In an SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

SEM typically includes such main constructional parts as an electron beam source (cathode having a small tip called "electron gun), an electron beam column, and a detection unit. The electron beam column comprises inter alia a beam aligning means (the so-called "alignment coils"), a beam shaping means (stigmator), and a focusing/deflecting assembly including a lens arrangement and a deflection system for directing a primary electron beam onto a sample and directing secondary electrons towards one or more detection unit. The deflection of the primary beam provides for scanning the beam within a scan area on the sample, and also for adjusting incidence of the primary beam onto the sample (an angle of incidence and/or beam shift).

Some systems of the kind specified utilize an objective lens arrangement in the form of a combination of a magnetic objective lens and an electrostatic lens, the so-called "compound magnetic-electrostatic lens" (e.g., WO 01/45136 and EP 1045425 both assigned to the assignee of the present application, and WO 01/56056). The electrostatic part of the compound magnetic-electrostatic lens is an electrostatic retarding lens (with respect to the primary charged particle beam), and has two electrodes held at different potentials, one of the two electrodes being formed by a cylindrical anode tube which is arranged within a magnetic objective lens along its optical axis, and the other electrode being a metallic cup provided below the magnetic objective lens. A need for a retarding field is associated with the following. In an SEM, in order to reduce the "spot" size of the electron beam up to nanometers, a highly accelerated electron beam is typically produced using accelerating voltages of several tens of kilovolts and more. Specifically, the electron optic elements are more effective (i.e., produce smaller aberrations) when the primary electrons are accelerated to high kinetic energy. Generally, the landing energy of the primary electron beam is defined by the potential difference between the cathode (a source of primary electrons formed with a small tip called "an electron gun) and the sample. To achieve the desired acceleration of electrons, an appropriate potential difference between the cathode and anode (which is typically in the form of a tube defining a primary beam drift space for the primary beam propagation to the sample) should be provided. For example, the cathode voltage $V_c$ can be about (−1) kV and the anode voltage $V_a$ can be about (+8) kV. Hence, the electrons are accelerated on their way towards the magnetic objective lens having the velocities of 9 keV However, it has been observed that such a highly energized electron beam causes damage to resist structures and integrated circuits, and, in the case of dialectical samples, causes the undesirable charging of the sample. To avoid these effects, a retarding field is created in the vicinity of the sample. The electric field created by the electrostatic lens also facilitates the extraction of secondary charged particles from the sample.

The above-indicated publication WO 01/56056 also discloses the use of a magnetic deflector integrated into a magnetic objective lens, which has an excitation coil and upper and lower pole pieces. The magnetic deflector comprises excitation coils located on the lower pole piece of the magnetic lens, and the lower pole piece is divided into four pole piece segments, each segment having its corresponding additional excitation coil of the deflector. The additional excitation coils are wrapped around the pole piece segments of the magnetic lens, so that by exciting one the additional excitation coils, a magnetic field is generated in the corresponding segment of the lower pole piece. The magnetic field is basically perpendicular to the path of the electron beam (to the optical axis). Accordingly, a magnetic field across the path of the electron beam is generated which leads to a deflection of the electron beam. Due to the segments of the lower pole piece of the magnetic lens, the magnetic field is guided to an area close above the sample and generates the required strong deflection field. The segments of the lower pole piece of the magnetic lens at the same time also guide the magnetic field generated by the excitation coil of the magnetic lens.

SUMMARY OF THE INVENTION

There is a need in the art to improve the control of charged particle beam propagation through a lens arrangement in a charged particle beam column towards a sample under inspection, by providing a novel deflection method and system, and a lens arrangement utilizing the same.

The present invention is aimed at increasing the deflecting magnetic field at the optical axis of the lens arrangement in the vicinity of the sample's plane at a given electric current through the excitation coils of the magnetic deflector, or obtaining a high magnetic field with a lower electric current through the excitation coils of the deflector. This allows for obtaining a desirably high deflecting magnetic field within the closest vicinity of the sample at the optical axis of the lens arrangement, without increasing a working distance, also in cases where the electrode of an electrostatic retarding lens is located between the magnetic objective lens and the sample.

The term "working distance" is typically referred to as a distance between the electrode of the lens arrangement closest to the sample's plane and the sample's plane. This distance should be as small as possible, and the minimal possible working distance is typically defined by an arcing problem. The present invention provides for concentrating the magnetic deflecting field at the optical axis of the lens arrangement in the vicinity of the sample's plane without affecting (increasing) the working distance, by providing a pole piece assembly at least partly located within the magnetic field of a magnetic deflector.

The problem solved by the present invention is associated with the following: To enable effective control of the magnetic field intensity in the vicinity of a sample (either grounded or not), an electrode closest to the sample should be formed with an opening as small as possible (e.g., of about 2 mm). Making the external pole piece of the magnetic objective lens with such a small opening will result in non-homogeneity of the magnetic and electric fields (due to the gaps between the pole piece segments of the magnetic objective lens or pole pieces of a magnetic deflector, as the case may be), and accordingly, in a distorted (blurred) image of the irradiated area of the sample. Using a larger inner diameter of the pole pieces is ineffective for both controlling the field intensity and deflection, since this requires a higher power supply resulting in undesirable heating of the pole pieces. In the above-described prior art constructions utilizing an electrostatic lens formed by the anode- and cup-electrodes, the reduction of the inner diameter of the magnetic objective lens or that of the deflector on the lens is limited by the funnel of the anode tube having a 15 mm diameter (under 8 kV and more voltage) inside the magnetic lens and the cup-electrode below the magnetic lens.

The present invention overcomes the above problem by providing the pole piece assembly, which conducts the magnetic field created by a magnetic deflector towards the optical axis of a lens arrangement (including a magnetic objective lens and optionally also an electrostatic lens). This increases the effectiveness of deflection by increasing a magnetic field for a given electric current through the excitation coils of the deflector (power supply). In this connection, it is important to note that it is often desired to operate with the so-called tilt mode, when a primary charged particle beam impinges onto a sample along an axis forming a certain angle with the sample's surface. The tilt mode is usually utilized to inspect samples that have a surface relief, i.e., pattern in the form of a plurality of spaced-apart grooves, to detect the existence of a foreign particle located inside a narrow groove. The tilt mode 25 can be achieved by passing higher electric currents through the excitation coils of the magnetic deflector, as compared to those of a normal mode of operation (i.e., the primary charged particle beam impinges onto the sample with substantially zero angle of incidence). The present invention facilitates operation with the tilt mode, since it provides for increasing a deflecting magnetic field at a given electric current through the excitation coils of the deflector.

Thus, according to the invention, a magnetic deflecting field is created by a magnetic deflector having excitation coils and preferably pole pieces (generally, at least two pole pieces), and conducting the magnetic field of the deflector to the optical axis by a pole piece assembly at least partly located in the magnetic field of the deflector (having a magnetic contact surface with the pole pieces of the deflector). The pole piece assembly has a portion made of a soft magnetic material and is formed with an opening for a charged particle beam passage therethrough. The pole piece assembly, when mounted in the focusing/deflecting assembly of the column, is located such that the optical axis of the lens arrangement intersects with said opening.

The pole pieces of the magnetic deflector and the pole piece assembly are preferably electrically insulated from each other, and may be accommodated adjacent to each other or partly overlapping. The pole piece assembly may be constructed such that it has at least two pole piece elements partly or completely separated from each other by gaps. Alternatively, the pole piece assembly may be in the form of a single pole piece element (e.g., shaped like a disc) with the opening, in which case the pole piece assembly and the pole pieces of the deflector partly overlap each other.

Each of the at least two pole piece elements of the pole piece assembly may be separately operated by a voltage supply, thereby enabling beam scanning of the sample along at least one axis. By providing at least four pole piece elements in the pole piece assembly, scanning along two mutually perpendicular axes can be achieved.

Preferably, the pole piece assembly also comprises a central portion, which is formed with said opening and is made of a non-magnetic metal, and is surrounded by said portion made of the soft magnetic material. This central portion made of the non-magnetic metal may thus serve as the electrode of an electrostatic lens, the other electrode thereof being either an anode tube or the pole piece of a magnetic objective lens.

There is thus provided according to one aspect of the present invention, a deflection system for use in a lens arrangement of a charged particle beam column for inspecting a sample, the system comprising:

a magnetic deflector operable to create a magnetic field;
a pole piece assembly which has a portion made of a soft magnetic material and is formed with an opening for a charged particle beam passage therethrough, the pole piece assembly being accommodated so as to be at least partly located within the magnetic field of the magnetic deflector to thereby conduct at least a portion of the magnetic field created by the deflector through the pole piece assembly towards said opening.

According to another aspect of the present invention, there is provided an electrostatic lens for use in a lens arrangement of a focusing/deflecting assembly in a charged particle beam column for inspecting a sample, wherein the focusing deflecting assembly comprises a magnetic deflector, the electrostatic lens comprising an electrode that is formed with an opening for a charged particle beam passage therethrough and is made of a non-magnetic metal; and comprising a pole piece assembly made of a soft magnetic material surrounding said electrode.

According to yet another aspect of the present invention, there is provided a focusing/deflecting assembly for use in a charged particle beam column for inspecting a sample, wherein:

the focusing/deflecting assembly comprises a lens arrangement and a deflection system;
the lens arrangement comprises an objective magnetic lens and an electrostatic lens having an electrode made of a non-magnetic metal and formed with an opening for a charged particle beam passage therethrough, said electrode being accommodated downstream of the magnetic objective lens with respect to a direction of a charged particle beam propagation towards the sample, such that an optical axis of the lens arrangement intersects with said opening;
the deflection system comprises a magnetic deflector and a pole piece assembly having a portion made of a soft magnetic material which surrounds said electrode of the electrostatic lens.

The present invention, also provides according to its yet another aspect, a method of controlling a beam propagation through a lens arrangement of a charged particle beam column for inspecting a sample, the method comprising:

creating a magnetic deflecting field; and
conducting at least a portion of said magnetic field towards an optical axis of the lens arrangement.

The terms "primary beam" and "primary charged particle beam" used herein signify a charged particle beam, which is formed by charged particles generated by a source (cathode), and which is to be directed to a sample to knock out charged particles forming a "secondary beam" (also referred to as "secondary charged particle beam"), which is to be detected.

The charged particle beam may be an electron beam or a focused ion beam (FIB). The present invention may be used with an SEM or a similar tool applied to a specimen, e.g., a semiconductor wafer, for imaging, measurements, metrology, inspection, defect review or such purposes. For example, the present invention may be used for CD measurements, line profile measurements, copper-interconnects inspection/measurements, typically performed after a photolithography process, for automatic defect classification, etc.

BRIEF DESCRIPTION OF THE DRAWINGS:

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
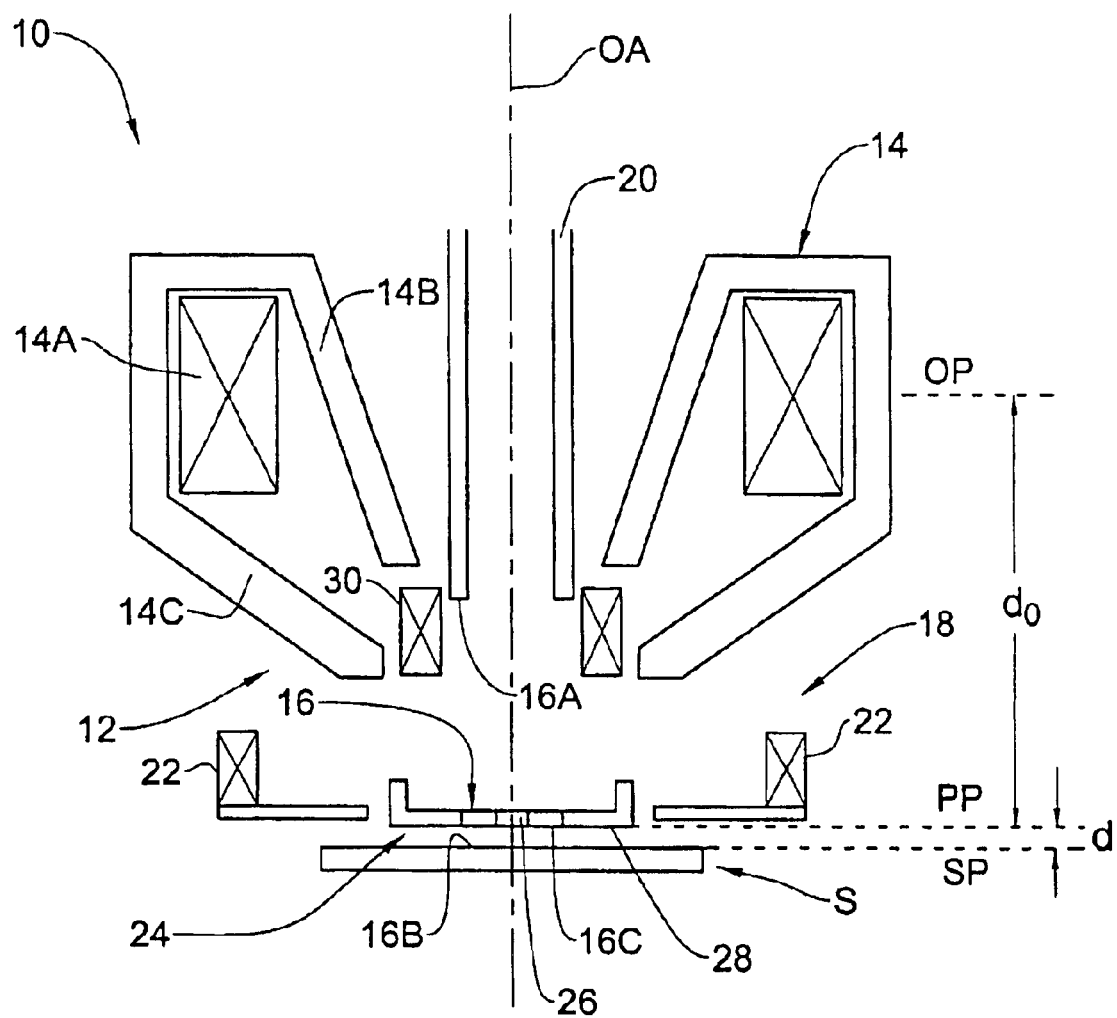
FIG. 1 is a schematic illustration of a part of a charged particle beam column associated with a focusing/deflecting utilizing a deflection system according to the invention.

Referring to FIG. 1, there is illustrated a part of a charge particle beam column (such as an SEM) including a focusing/deflecting assembly, generally at 10, associated with a sample S under inspection. The focusing/deflecting assembly 10 includes a lens arrangement 12 defining an optical axis OA, and a deflection system 18. The lens arrangement 12 includes an objective lens 14 and, in the present example, also includes an electrostatic lens 16. The objective lens 14 is typically a magnetic lens formed by excitation coils 14A and two pole pieces 14B and 14C. In the present example, the electrostatic lens 16 is formed by three electrodes 16A, 16B and 16C, wherein the lower end of an anode tube 20 serves as the first electrode 16A, the sample's surface serves as the second electrode 16B, and the third electrode 16C (the so-called cup-electrode) is located between the electrodes 16A and 16B, and serves for regulating an electric field created in the vicinity of the sample.

It should be understood that any other suitable design of the electrostatic lens is possible. It should also be understood that such an electrostatic lens serves as a retarding immersion lens for decelerating a primary electron beam propagating to the sample, while the electric field created by this lens facilitates the extraction of secondary electrons knocked-out from the sample by the primary electron beam. For example, the cathode voltage can be about (−1) kV and the anode voltage can be about (+8) kV. Hence, the primary electrons are accelerated on their way towards the magnetic lens 14, and have the velocities of 9 keV To create the retarding field, the voltage applied to the electrode 16B (sample's surface) is typically substantially less than that of the anode. For example, the case may be such that the sample is grounded and the electrodes are biased, that is the following voltages may be applied to, respectively, the cathode, anode and the third electrode 16C: (−1) kV; (+8) kV and (+3) kV.

It should also be noted that for the primary electron deceleration purposes, the provision of any electrostatic lens as an actual physical element is optional. The same effect of the electrons' deceleration, namely the creation of a retarding electric field, may be achieved by applying appropriate voltages to the anode and sample, or to the anode, pole piece of the magnetic objective lens and sample. The following are two possible examples of the electric parameters: (1) the sample is biased to (−5) kV, the anode voltage is equal to zero and the cathode voltage is (−6) kV; (2) the sample is biased to (−3) kV, the magnetic lens' pole piece voltage is equal to zero, and the anode and cathode voltage are, respectively, (+5) kV and (−4) kV. As for extracting the secondary electrons, the provision of such an additional electrode 16C is preferred.

The deflection system 18 includes a magnetic deflector 22 and a pole piece assembly 24. The pole piece assembly 24 has a portion 28 made of a soft magnetic material ($\mu$-metal), such as Conetic AA having about 79% Ni, or Conetic B—B having about 45% Ni). In the present example, the cup-electrode electrode 16C forms a part of the pole piece assembly 24. Thus, in the present example, the pole piece assembly 24 has a disc-like shape with the central portion 16C that is made of a non-magnetic metal, such as aluminum, stainless steel, copper, etc. and is formed with a central opening 26 for the electron beam passage therethrough (primary and secondary electrons), and has the periphery portion 28 made of a soft magnetic material. The thickness of the portion 28 is, for example, about 1 mm.

The pole piece assembly 24 is at least partly accommodated within the magnetic field created by the deflector 22, and conducts this magnetic field towards the opening 26 (i.e., towards the optical axis OA of the lens arrangement). By this, the deflecting field at the optical axis OA in the vicinity of the sample can be increased at a given electric current through the excitation coils of the magnetic deflector without affecting a working distance d, i.e., a distance between a plane PP of the electrode of the lens arrangement closest to the sample's plane SP (the cup-electrode 16C in the present example) and the sample's plane SP. For example, with the HAR mode (e.g., the cup-electrode voltage being 3 kV (HAR mode), the working distance d of 0.8 mm can be obtained with a distance $d_0$ between the objective-lens' plane OL and the pole piece assembly's plane PP being 4.2 mm.

Also provided in the focusing/deflecting assembly 10 is an additional deflector 30 that may serve for scanning the primary beam and/or for operating together with the deflection system 18 to provide both the desired incidence of the primary electron beam onto the sample (normal or tilt mode) and scanning the primary beam. It should be noted that, generally, additional scanning coils located adjacent to the deflector 30 may be used. The use of two deflectors spaced-apart along the optical axis for providing both desired incidence and scanning of the primary electron beam is disclosed in co-pending U.S. application Ser. No. 09/479, 664 assigned to the assignee of the present application, and does not form part of the present invention.

Figure 2A:
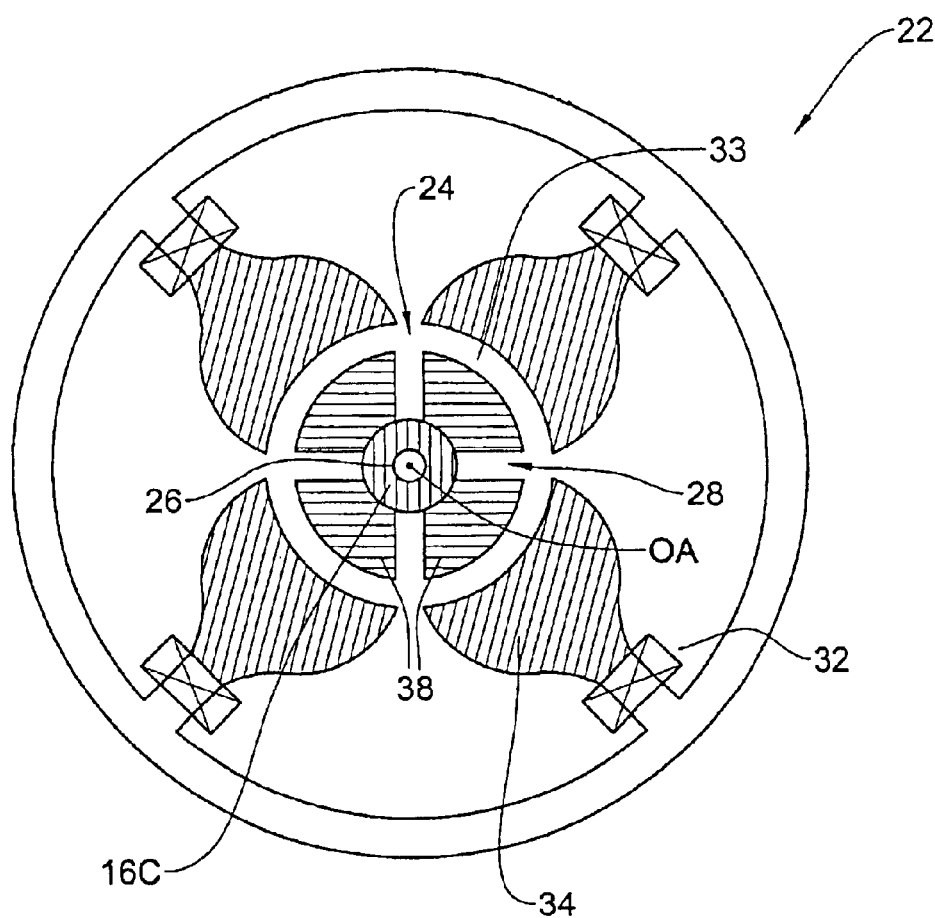
FIGS. 2A and 2B are, respectively, top and cross-sectional side views of the deflection system according to one embodiment of the invention.
Figure 2B:
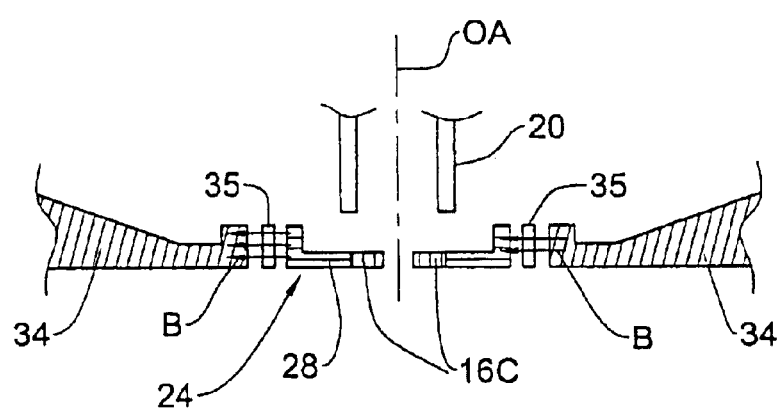

FIGS. 2A and 2B illustrate the deflection system 18 according to one embodiment of the invention. As shown, the magnetic deflector 22 has excitation coils, generally at 32, and pole pieces—four such pole pieces 34 in the present example. Generally, the magnetic deflector 22 may be formed with at least two pole pieces. The pole pieces assembly 24 has the central portion occupied by the electrode 16C made from the non-magnetic metal, and the periphery portion 28 made from the soft magnetic material. The pole piece assembly 24 is accommodated such that the optical axis OA intersects with the opening 26. As shown, in the present example, the pole piece assembly 24 is accommodated inside an opening 33 defined by the pole pieces 34 of the deflector 22, and is insulated from the pole pieces 34, e.g., by a dielectric element 35 or by just spacing the assembly 24 from the pole pieces 34 (vacuum between them). The respective regions of the soft magnetic portion 28 of the assembly 24 form extensions of the pole pieces 34 of the magnetic deflector 22 to the optical axis OA. As also exemplified in FIGS. 2A and 2B, the soft magnetic portion 28 of the pole pieces assembly 24 may be divided into at least two separated pole piece elements—four such elements 38 being used in the present example.

As will be described further below, the provision of such separated pole piece elements, as well as the complete separation between them, is optional. However, if the portion 28 is divided into the pole piece elements (partly or completely separated from each other), the number of the pole piece elements preferably corresponds to that of the pole pieces 34 of the magnetic deflector 22 to provide better homogeneity of the magnetic field in the vicinity of the optical axis OA. If the entire pole piece assembly 24 is located inside or slightly below the opening 33 of the deflector 22, with no overlap between the assembly 24 and the pole pieces 34, the above design of the assembly 24, namely comprising at least partly separated pole piece elements 38, is preferred.

Figure 3A:
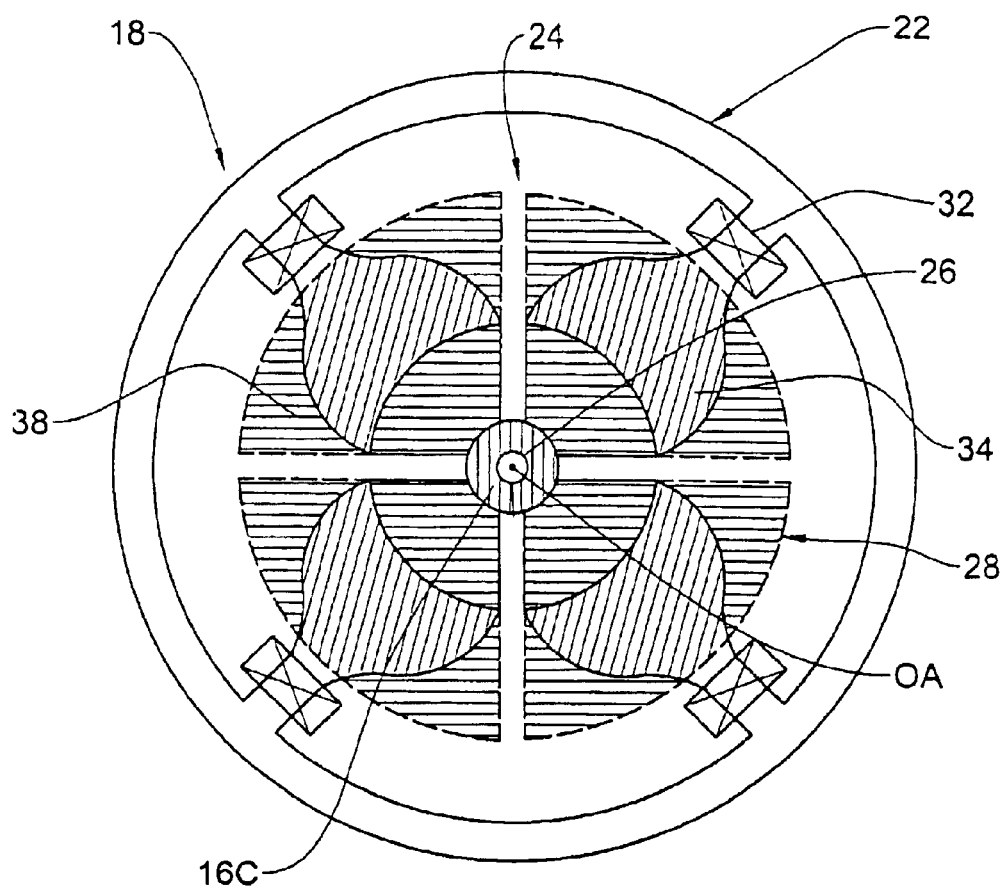
FIGS. 3A and 3B are, respectively, top and cross-sectional side views of the deflection system according to another embodiment of the invention.
Figure 3B:
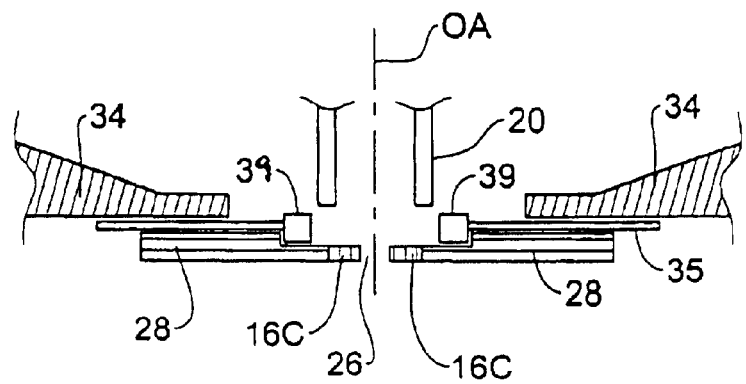

FIGS. 3A and 3B illustrate the deflection system 18 of a somewhat different design according to another embodiment of the invention. Here, similar to the above-described example, the pole piece assembly 24 comprises the soft magnetic portion 28 surrounding the electrode 16C of the electrostatic lens. In distinction to the previous example, the pole pieces assembly 24 of FIGS. 3A–3B is designed such that its portion 28 (e.g., divided into several pole pieces 38 at least partly separated from each other) partly overlaps with the pole pieces 34 of the magnetic deflector 22, being located below the pole pieces 34 (closer to the sample's surface). In the present example, where the cup-electrode 16C forms a part of the assembly 24 and the separated pole piece elements 38 of the assembly 24 overlap with the pole pieces 34 of the deflector, a non-magnetic metallic element 39 (diaphragm) is preferably provided, being installed within the gaps between the pole piece elements 38. This provides for avoiding distortions of an electric field created by a voltage supply to the electrode 16C.

Figures 4A, 4B, 4C:
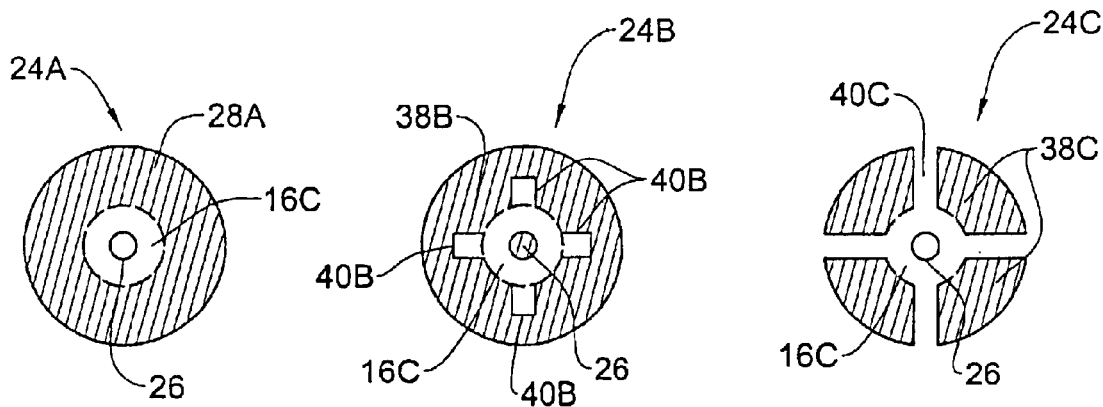
FIGS. 4A to 4C are schematic illustrations of three examples, respectively, of a pole piece assembly used in the deflection system of the present invention.

Reference is now made to FIGS. 4A–4C showing three different examples of the pole piece assembly 24 according to the invention. In all these examples, the electrode 16C forms the central portion of the assembly 24 and is shown in dashed lines, since the provision thereof is generally optional for the purposes of the present invention, i.e., conducting the magnetic field of the deflector 22 to concentrate it at the optical axis OA. The electrode 16C is preferably provided as the central portion of the assembly 24 to create an electric field facilitating extraction of secondary electrons and/or decelerating primary electrons prior to their incidence onto the sample.

In the example of FIG. 4A, a pole piece assembly 24A has a single pole piece element 28A. This design is suitable to be used in the example of FIGS. 3A–3B, where the soft magnetic portion 28 of the assembly 24 partly overlaps with the pole pieces 34 of the magnetic deflector 22. In the example of FIG. 4B, the soft magnetic portion 28B has four pole piece elements 38B which are partly separated from each other by gaps 40B. A pole piece assembly 24C of FIG. 4C has its soft magnetic portion 28C divided into separate pole piece elements 38C spaced by gaps 40C.

Turning back to FIGS. 2B and 3B, the soft magnetic portion 28 (one or more pole piece elements, as the case may be) of the assembly 24 is preferably electrically insulated from the pole pieces 34 of the magnetic deflector 22. This is implemented by spacing the portion 28 from the pole pieces 34 and, possibly, also locating the dielectric element 35 between them. In order to reduce a magnetic resistance of the deflection system 18, the space (gap) between the soft magnetic portion 28 of the assembly 24 and the pole pieces 34 of the magnetic deflector 22 should preferably be as small as possible. For the same purpose, in the construction of FIG. 3B, the width of the pole piece elements of the assembly 24 is preferably not less than that of the pole pieces 34 of the deflector 22. In other words, the entire surface of magnetic contact between the pole piece elements of the assembly 24 and the pole pieces of the deflector 22, defining the surface through which the magnetic field created by the deflector "penetrates" into the soft magnetic portion of the assembly 24, should preferably be as large as possible. Thus, the space (gap) between these surfaces should be reduced, and the surface of magnetic contact should be increased, to thereby reduce the field energy losses. To provide electrical stability of the deflection system 18, the dielectric element 35 should preferably be of a small thickness. For example, a thin Kapton film can be used as the dielectric element 35.

When selecting the optimal inner diameter of the soft magnetic portion 28 of the assembly 24, the following factors should be taken into consideration. The value of the inner diameter of the soft magnetic portion 28 is limited by a required region of a homogeneous magnetic field in the vicinity of the optical axis OA (near-axis region): the larger this diameter the larger the region of the homogeneous field. Making this inner diameter too small will result in that the mechanical defects and defects of the magnetic material strongly affect the homogeneity of the magnetic field in the near-axis region. However, increasing this diameter reduces the effectiveness of deflection.

As indicated above with reference to FIG. 3B, the pole piece elements 38 of the assembly 24 may be separated by gaps with the non-magnetic metallic element 39 therein. When using the cup-electrode 16C in the assembly 24, this allows for avoiding the distortions of the electrostatic field created by the cup-electrode. Thus, the assembly 24 may comprise the cup-electrode 16C, and several electrically separated pole piece elements 38 that are kept together by the ring 39 made from a non-magnetic metal. This ring also serves for mounting the assembly 24 onto the funnel of anode tube.

It should be noted, that, in the absence of the cup-electrode 16C, making the element 39 from a dielectric material, can be used to provide electrical deflection (the so-called "fast scanning") by the assembly 24, in addition to magnetic deflection. The fast scanning is used when selective imaging of the sample with a smaller field of view (as compared to that of the main scan) is needed. A separate voltage supply to the electrically insulated pole piece elements 38 allows for scanning the primary electron beam either along one axis, if one pair of pole piece elements is used, or along two mutually perpendicular axes, if at least two pairs of such elements are used.

As also shown in FIGS. 2B and 3B, a magnetic flux B generated by the magnetic deflector 22 passes through the pole pieces 34 of the deflector and penetrates into the respective (adjacent) region of the soft magnetic portion 28 of the assembly 24, through a small gap and large surface of magnetic contact. The magnetic flux B passes through the assembly 24 towards the opening (i.e., towards the optical axis OA), and while emerging from the portion 28 at the opposite region thereof, enters the pole pieces of the deflector 22. Hence, a magnetic field required for the magnetic deflection of the electron beam from or to the optical axis OA (for example, to achieve a tilt mode or a beam shift) is concentrated at the optical axis OA. If the cup-electrode 16C is used and is electrically insulated from the pole pieces of the deflector, the cup-electrode can be operated by a separate voltage supply to create a required electric field for decelerating primary electrons and accelerating secondary electrons.

One of the important tasks of scanning electron microscopy is to achieve the primary beam tilt (when inspecting patterned structures such as semiconductor wafers) and/or beam shift deflection, with a minimal electric current through the excitation coils of the magnetic deflector. The present invention solves this problem by providing the deflection system 18 utilizing the magnetic deflector 22 preferably with pole pieces 34, and the pole piece assembly 24 (with or without the cup-electrode 16C).

Figure 5:
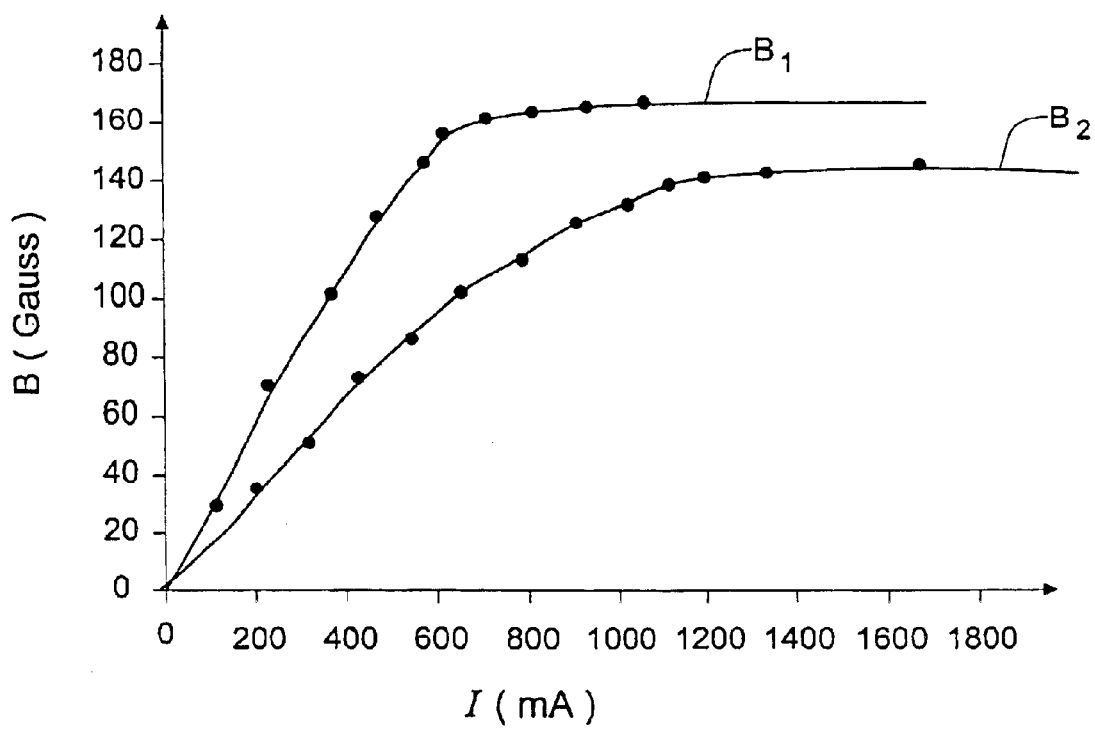
FIG. 5 illustrates experimental results showing the magnetic field at the optical axis of the lens arrangement achieved with the deflection system of the invention utilizing the pole piece assembly, as compared to that obtained with a deflection system having no such assembly.

The advantageous use of the deflection system 18 for the above purpose is illustrated in FIG. 5, showing experimental results obtained with the deflection system 18 of the present invention, namely, including the magnetic deflector 22 having the pole pieces and the additional pole piece assembly 24 (graph $B_1$), and with the magnetic deflector 22 and no additional pole assembly (graph $B_2$). Graphs $B_1$ and $B_2$ present the magnetic field created by the electric current passage through the excitation coils of the deflector 22 and measured at the optical axis of the lens arrangement, as functions of the electric current through the excitation coils. Graph $B_1$ was obtained with the assembly 24 design of FIG. 4C and the arrangement of FIGS. 3A–3B, with the following conditions: the pole piece elements 38 are made of the Conetic AA material of a 1 mm thickness; an inner diameter of the pole piece elements 38 is 8 mm; a gap between the elements 38 is 1 mm; the pole piece elements 38 and the pole pieces 34 of the deflector 22 are spaced from each other at a distance of 0.3 mm; an inner diameter of the pole pieces 34 of the deflector 22 is 18 mm; and the magnetic contact surface between the elements 38 and the pole pieces 34 is 39 mm. Graph $B_2$ was obtained with the deflector 22 whose pole pieces define the 18 mm inner diameter of the deflector. As clearly seen in FIG. 5, the use of the pole piece assembly 24 results in a higher magnetic field saturation value (160 Gauss) achieved at a 600 mA electric current through the excitation coils (graph $B_1$), as compared to the magnetic field saturation value of 140 Gauss achieved at a 1200 mA electric current without the use of the assembly 24. Thus, the present invention provides for obtaining approximately the same and even slightly higher magnetic field in the inner-axis region with a 2 times less electric current through the excitation coils. In order to provide the tilt mode of a 15° angle between the axis of the primary electron beam and the optical axis, a magnetic field of about 85 Gauss should be provided in the vicinity of the optical axis. As clearly shown in the graphs, the use of the magnetic deflector with pole pieces and no pole piece assembly 24 enables to obtain this magnetic field with the electric current of about 0.6A through the excitation coils, and when using the pole piece assembly 24, the electric current of about 0.3A is sufficient to obtain the required magnetic field at the optical axis. Accordingly, the use of the pole piece assembly provides for significantly reducing the required power ($I^2$).

Those skilled in the art will readily appreciate that modifications and changes can be applied to the embodiments of the invention as hereinbefore exemplified without departing from its scope defined in and by the appended claims.

What is claimed is:

1. A deflection system for use in a lens arrangement of a charged particle beam column for inspecting a sample, the system comprising:

a magnetic deflector operable to create a magnetic field;

a pole piece assembly which has a portion made of a soft magnetic material and is formed with an opening for a charged particle beam passage therethrough, the pole piece assembly being accommodated so as to be at least partly located within the magnetic field of the magnetic deflector to thereby conduct at least a portion of the magnetic field created by the deflector through the pole piece assembly towards said opening and wherein the pole piece assembly is operable by a voltage supply to create an electric field in the vicinity of the sample.

2. The system according to claim 1, wherein the magnetic deflector comprises excitation coils and pole pieces.

3. The system according to claim 2, wherein a magnetic contact surface exists between said portion made of the soft magnetic materials and the pole pieces of the magnetic deflector.

4. The system according to claim 2, wherein said pole pieces of the magnetic deflector and the pole piece assembly are electrically insulated from each other.

5. The system according to claim 4, wherein said pole pieces of the magnetic deflector and the pole piece assembly are spaced-apart from each other to form a gap therebetween.

6. The system according to claim 5, wherein a dielectric element is located in said gap.

7. The system according to claim 1, wherein said pole piece assembly is shaped like a disk with the opening.

8. The system according to claim 1, wherein said pole piece assembly comprises at least two pole piece elements made of the soft magnetic material and partly spaced from each other.

9. The system according to claim 1, wherein said pole piece assembly comprises at least two pole piece elements made of the soft magnetic material and separated from each other by gaps.

10. The system according to claim 9, wherein an element made of a non-magnetic metal is located in each of the gaps.

11. The system according to claim 9, wherein an element made of a dielectric material is located in each of the gaps.

12. The system according to claim 1, wherein the pole piece assembly comprises a central portion made of a non-magnetic metal, which is formed with said opening and is surrounded by said portion made of the soft magnetic material.

13. The system according to claim 12, wherein pole pieces of the magnetic deflector and the pole piece assembly are electrically insulated from each other.

14. The system according claim 12, wherein said pole piece assembly is shaped like a disk with the opening.

15. The system according to claim 12, wherein said portion of the pole piece assembly made of the soft magnetic material comprises at least two pole piece elements partly spaced from each other.

16. The system according to claim 12, wherein said portion of the pole piece assembly made of the soft magnetic material comprises at least two pole piece elements separated from each other by gaps.

17. The system according to claim 16, wherein an element made of a non-magnetic metal is located in each of the gaps between the pole piece elements.

18. The system according to claim 16, wherein an element made of a dielectric material is located in each of the gaps between the pole piece elements.

19. An electrostatic lens for use in a lens arrangement of a focusing/deflecting assembly in a charged particle beam column for inspecting a sample, wherein the focusing deflecting assembly comprises a magnetic deflector, the electrostatic lens comprising an electrode that is formed with an opening for a charged particle beam passage therethrough and is made of a non-magnetic metal; and comprising a pole piece assembly made of a soft magnetic material surrounding said electrode, wherein the pole piece assembly is operable by a voltage supply to create an electric field in the vicinity of the sample.

20. The lens according to claim 19, wherein said pole piece assembly has a magnetic contact surface with pole pieces of the magnetic deflector.

21. The lens according to claim 19, wherein said pole piece assembly comprises at least two pole piece elements partly spaced from each other.

22. The lens according to claim 19, wherein said pole piece assembly comprises at least two pole piece elements separated from each other by gaps.

23. The lens according to claim 22, wherein an element made of a non-magnetic metal is located in each of the gaps between the pole piece elements.

24. The lens according to claim 22, wherein an element made of a dielectric material is located in each of the gaps between the pole piece elements.

25. A focusing/deflecting assembly for use in a charged particle beam column for inspecting a sample, wherein:

the focusing/deflecting assembly comprises a lens arrangement and a deflection system;

the lens arrangement comprises an objective magnetic lens and an electrostatic lens having an electrode made of a non-magnetic metal and formed with an opening for a charged particle beam passage therethrough, said electrode being accommodated downstream of the magnetic objective lens with respect to a direction of a charged particle beam propagation towards the sample, such that an optical axis of the lens arrangement intersects with said opening; and a vole piece assembly being accommodated so as to be at least partly located within the deflection system and wherein the pole piece assembly is operable by a voltage supply to create an electric field in the vicinity of the sample.

26. A method of controlling a beam propagation through a lens arrangement of a charged particle beam column for inspecting a sample, the method comprising:

creating a magnetic deflecting field by a magnetic deflector having excitation coils and pole pieces;

conducting at least a portion of said magnetic field towards an optical axis of the lens arrangement by means of a pole piece assembly having a magnetic contact surface with the pole pieces of the magnetic deflector; and operating the pole piece assembly with a voltage supply.

27. The method according to claim 26, comprising electrically insulating said pole pieces of the magnetic deflector and the pole piece assembly from each other, thereby enabling separate electric operation of the pole piece assembly by a voltage supply.

28. The method according to claim 26, comprising creating an electric field in the vicinity of the sample to control propagation of a secondary charged particle beam with the sample, from the sample.

29. The method according claim 26, wherein said pole piece assembly comprises at least two pole piece elements made of the soft magnetic material and separated from each other by gaps, the method comprising separately operating said at least two pole piece elements by the voltage supply, thereby controlling propagation of a primary charged particle beam towards the sample.

30. The method according to claim 29, wherein said controlling comprises scanning the charged particle beam within a scan area of the sample along at least one axis.

31. The method according to claim 26, wherein the pole piece assembly comprises a central portion made of a non-magnetic metal, the method comprising creating an electric field by the voltage supply to said central portion to control propagation of a secondary charged particle beam, produced by interaction of a primary charged particle beam with the sample from the sample.

* * * * *